United States Patent [19]

Masters et al.

[11] 4,434,217

[45] Feb. 28, 1984

[54] CHALCOGENIDE PRODUCT

[75] Inventors: Joseph I. Masters, Lincoln; Gershon M. Goldberg, Arlington, both of Mass.

[73] Assignee: GCA Corporation, Bedford, Mass.

[21] Appl. No.: 222,714

[22] Filed: Jan. 5, 1981

Related U.S. Application Data

[60] Division of Ser. No. 86,198, Oct. 17, 1979, Pat. No. 4,269,935, which is a continuation-in-part of Ser. No. 57,183, Jul. 13, 1979, abandoned.

[51] Int. Cl.$^3$ .................................................. G03C 5/24
[52] U.S. Cl. ............................................... 430/9; 430/14; 430/271; 430/523; 430/495
[58] Field of Search ............... 430/271, 326, 313, 323, 430/325, 302, 14, 9, 5, 495, 523, 325

[56] References Cited

U.S. PATENT DOCUMENTS

| | | | |
|---|---|---|---|
| 3,511,661 | 5/1970 | Rauner et al. | 430/302 |
| 3,578,451 | 5/1971 | Doggett | 430/155 |
| 3,637,383 | 1/1972 | Hallman et al. | 430/322 |
| 4,127,414 | 11/1978 | Yoshikawa et al. | 430/313 |
| 4,188,215 | 2/1980 | Sato et al. | 430/156 |

OTHER PUBLICATIONS

Yoshikawa, et al.: A Novel Inorganic Photoresist Utilizing Ag Photodoping in Se–Ge Glass Films, Applied Physics Letters, vol. 29, No. 10, Nov. 1976, pp. 677–679.

*Primary Examiner*—Won H. Louie, Jr.
*Attorney, Agent, or Firm*—Kenway & Jenney

[57] ABSTRACT

A layer of a chalcogenide glass resist material, on a substrate on which a microlithographic pattern is to be formed, has a deposit of silver halide on its outer surface. By actinic irradiation a latent silver image replicating the desired pattern is formed in the halide deposit. This image is developed to a metallic silver, which is used to photodope the resist material for subsequent etching to produce the microlithographic pattern on the substrate. Positive and negative patterns are possible from the same starting laminate. One form of a microlithograhic pattern is a mask for producing electronic circuits.

1 Claim, 18 Drawing Figures

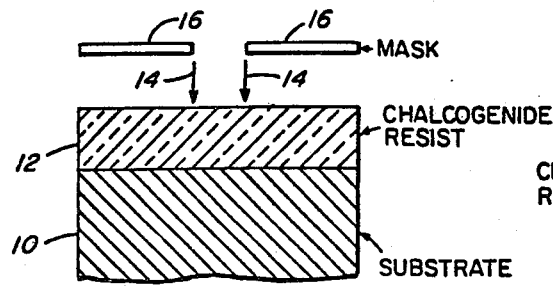
FIG. 1
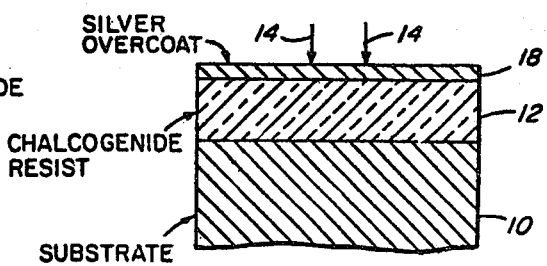
FIG. 3
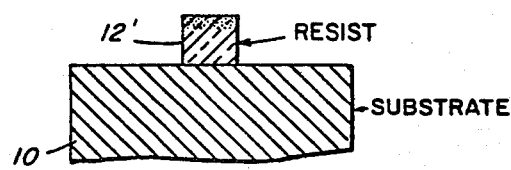
FIG. 2
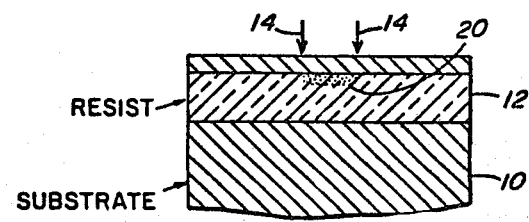
FIG. 4
FIG. 5
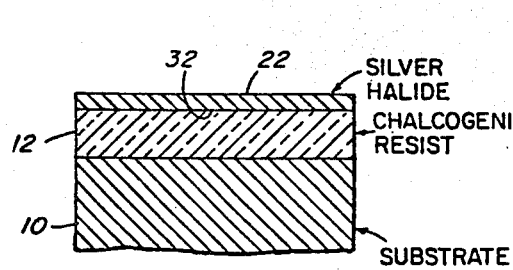
FIG. 6
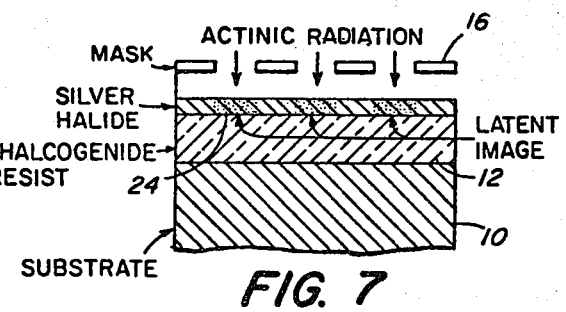
FIG. 7
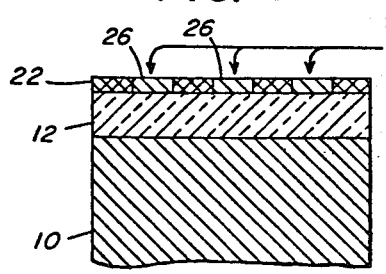
FIG. 8
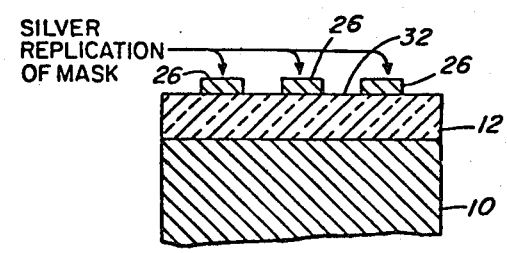
FIG. 9

CHALCOGENIDE PRODUCT

RELATED APPLICATIONS

This is a division of application Ser. No. 86,198, filed Oct. 17, 1979, U.S. Pat. No. 4,269,935, which in turn is a continuation-in-part of application Ser. No. 57,183, filed Jul. 13, 1979, abaonded.

BACKGROUND OF THE INVENTION

In the fabrication of microlithographic patterns, for use, as examples, in photoetching processes (e.g. processing semiconductor integrated circuits and in production of electronic circuits) there is a continuing need to improve photoresist materials in order to create and to replicate high-density information patterns on semiconductor bodies and other substrates. Properties of increasingly high resolution, fast and faithful response to control energy whether in the form of a plasma, an electron beam, heat energy, visible light, or other, are all desired.

Chalcogenide glass films, such as Se-Ge glasses, $As_2S_3$ glasses or other binary glassy compounds of oxygen, sulfur, selenium and tellurium, have been found to exhibit a selective etching effect due to photoexposure such that they are suitable for use as photoresist materials. Being glass, i.e., amorphous in structure, they exhibit also high resoltion capabilities suitable for microlithographic applications (Nagai, et al, "New application of Se-Ge glasses to silicon micro-fabrication technology," Applied Physics Letter, Vol. 28, No. 3, Feb. 1 1976, pages 145-147).

It is known that a thin (less than 100 Angstrom units) layer of metallic silver on a chalcogenide glass acts to "photodope" the glass, as the silver can be driven into the glass to improve the photoresist properties. When silver is in the chalcogenide glass in patterns, there is differential resistance to etching compositions. (Yoshikawa, et al, "A novel inorganic photoresist utilizing Ag photodoping in Se-Ge glass films," Applied Physics Letters, Vol. 29, No. 10, Nov. 15 1976, pages 677-679). The same effects of photodoping were later observed in electron-beam irradiation (Yoshikawa, et al. "A new inorganic electron resist of high contrast," Applied Physics Letters, Vol. 31, No. 3, Aug. 1 1977, pages 161-163). Electron irradiation on a double-layered film of Ag and Se-Ge glass, like irradiation with light, gives rise to driving silver into the underlying Se-Ge layer.

When silver is forced into a chalcogenide glass in patterns for etching, the silver-doped chalcogenide becomes insoluble in alkaline solutions. It has been suggested that silver halide can be used in place of silver to supply the silver for photodoping through dissociation into metallic silver and halogen gases upon irradiation, and a 20 nm thick layer of AgCl deposited from vapor on a glass film of $As_2S_3$ and 300 nm thick has been reported to be useful for photodoping, but its sensitivity, or photographic speed is still slower than desired (Kolwicz and Chang "Silver Halide-Chalcogenide Glass Inorganic Resists for X-Ray Lithography"- unpublished).

When Se-Ge glass is etched after conventional photoexposure the result is a photographically positive photoresist, or a resist in which the exposed areas of the glass are etched away. At least one report states that the opposite is true of an $As_2S_3$ glass where conventional photoexposure and etching yield a negative resist (Kolwicz and Chang, supra). However, when the glass is "photodoped" and silver is driven into the glass by a pattern of actinic radiation, both the Se-Ge glass and the $As_2S_3$ glass form a negative resist. (Yoshikawa, et. al., Applied Physics Letters, Vol. 29, No. 10, pages 677-679).

GENERAL DESCRIPTION OF THE INVENTION

In the present invention a composite resist made of silver halide on chalcogenide glass is used photographically to provide a novel microlithographic process which is faster than any heretofore available, together with several novel intermediate products. The composite resist can be processed to a photographic positive or a photographic negative which replicates the desired pattern. Silver is provided by a process of exposure of the silver halide to actinic radiation followed by photographic processing to provide silver in a pattern. This silver pattern can be used to photodope the underlying glass layer with the application of heat, as by irradiation with an infrared flood light or by another method of causing the silver to penetrate into the glass. Production of the latent silver image in the silver halide requires much less energy than is required to bring about direct dissocation of silver halide into metallic silver and a gas and the present invention is thus "faster" in the photoresponsive sense, thus generating an important manufacturing advantage.

The silver halide deposit is not necessarily and not usually in the form of a continuous layer. This deposit generally originates in the form of separate droplets or islands of silver halide, which may be in the 0.1 micron range, and only as this deposit becomes thicker do these islands touch each other and then overlap to become an essentially continuous covering or layer. This result is particularly true with chalcogenide glass substrates such as arsenic trisulfide which apparently is not wetted by the depositing silver halide. When this deposit is in the form of multitudinous island of silver halide, and has an effective thickness well under 0.3 micron, it operates in a fully satisfactory manner and, in fact, in some ways produces better results. In contrast, prior patents relating to the making of silver halide photographic layers by deposition from the vapor phase have proposed continuous layers, and such continuity has previously been considered important. LuValle et al., 3,219,448, issued Nov. 23, 1965; Col. 9, lines 39-45). In the present invention, the silver halide deposit can be much thinner than prior art photographic layers, such as in the range of 100 Angstrom units or less. It is preferably described as a deposit distributed over the outer surface of the chalcogenide resist material, so as to include within its scope either a continuous layer or a distribution of aggregates of microcrystals which do not necessarily touch each other. The invention makes possible the design of a composite resist of silver halide on chalcogenide glass, which will permit development of a photographically latent silver image into silver for use in microlithography and at the same time provide sufficient silver for the photodoping step that follows, preferably without providing substantially more silver than is necessary for adequate photodoping of the immediately-underlying glass.

The invention is described in detail with reference to the accompanying drawings, which illustrate the prior art and some embodiments of the invention as it is best understood at the present time.

BRIEF DESCRIPTION OF THE DRAWINGS

FIGS. 1 to 5 inclusive illustrate the prior art.

FIG. 1 shows a chalcogenide resist on a substrate, being irradiated as through a mask;

FIG. 2 illustrates the product formed from FIG. 1 after irradiation and treatment, to provide a pattern of resist replicating the pattern in the masked surface of the substrate;

FIG. 3 shows a second stage in the prior art wherein a silver overcoat is provided over the resist prior to irradiation or subsequent treatment;

FIG. 4 illustrates the irradiation of the article in FIG. 3;

FIG. 5 illustrates the pattern of irradiation fixed on a surface of the substrate after treatment of the product shown in FIG. 4;

FIGS. 6 to 18, inclusive, illustrate embodiments of the present invention;

FIG. 6 illustrates the starting article comprised of a substrate having a chalcogenide resist layer on it and on an outer layer of the resist a deposit of silver halide;

FIG. 7 illustrates exposure of the silver halide deposit to actinic radiation, as through a mask, to provide a latent image of the pattern in the mask, in the silver halide deposit;

FIG. 8 illustrates a silver replication of the mask formed by developing the latent image of FIG. 7 into a metallic silver pattern which is a negative replication of the pattern of the mask;

FIG. 9 illustrates the substrate with chalcogenide resist on it bearing the metallic silver negative replication of the mask after fixing and removing the unexposed and undeveloped silver halide;

FIG. 10 illustrates the metallic silver pattern "doped" into the chalcogenide resist;

FIG. 11 illustrates the negative positive pattern of the mask replicated in the resist material after etching and treating the resist to remove that portion unprotected by the metallic silver doping mask;

FIGS. 12 and 13 are illustrations of the general nature of discontinuous thin silver halide deposits;

FIG. 14 illustrates a second embodiment of the invention wherein a positive pattern is formed in the resist; in FIG. 14 the silver replication of a mask as existing in the intermediate article shown in FIG. 8 has been removed, and the unexposed silver halide has been allowed to remain on the resist;

FIG. 15 illustrates a latent image formed in the previously unexposed silver halide;

FIG. 16 illustrates a metallic silver image formed from the latent image of FIG. 15;

FIG. 17 illustrates the negative pattern reproduced in the resist after photodoping, etching and treatment to remove that portion of the resist not covered by the doped-in silver; and, FIG. 18 illustrates a starting article for practicing the invention which includes a protective overcoat covering the silver halide deposit.

DETAILED DESCRIPTION OF THE DRAWINGS

Figure 10:
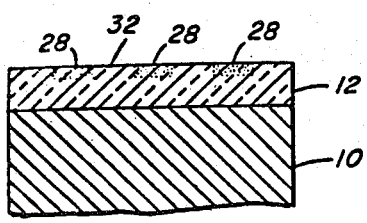

Referring now to FIGS. 1–5, illustrating the prior art, a substrate 10, which for the purposes of the present disclosure is a semiconductor material on which it is desired to form a pattern with microlithographic techniques, and which is coated with a chalcogenide resist material 12, is irradiated with suitable energy in a limited region defined between two downwardly arrows 14, which may be accomplished by the use of a sharply-focused electron beam (not shown) or through a mask 16 as shown having an appropriate aperture to define the region between the two arrows 14. As is known in the art, appropriate irradiation will alter the character of a chalcogenide resist material quantitatively so that when treated with an etchant the resist material will be more resistant to the etchant in the region where irradiated than in other regions with the result that, as is illustrated in FIG. 2, subsequent removal of the resist material with an appropriate etchant will differentially remove the resist material and a thinner portion of the resist material 12' will be left marking the pattern of the irradiation on a surface of the substrate 10.

FIGS. 3, 4 and 5 represent the subsequent development in the art according to which a silver overcoat 18 is provided on the resist material 12 prior to irradiation, and the irradiation has the effect of "driving" some silver into the underlying resist layer so as to dope the underlying layer with silver particles, as is illustrated at 20. This is known as "photodoping" the chalcogenide resist. Resistance to subsequent etching is increased in this manner so that, as is shown in FIG. 5, subsequent treatment with an etchant to remove the portion of the chalcogenide resist material which was not exposed to irradiation leaves the exposed portin 12' under the silver dopant 20 substantially as thick as the original chalcogenide resist layer 12. One result is that finer resolution can be achieved and that processing is less susceptible to error.

Figure 11:
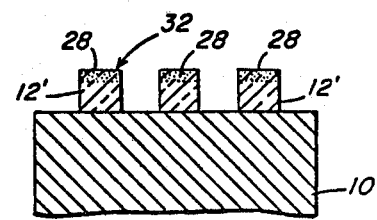

The present invention uses as its starting article the combination shown in FIG. 6 wherein a deposit of silver halide 22 is provided on the chalcogenide resist layer 12. When the end product is to be used as a mask, a presently preferred substrate is quartz. As is pointed out above in the review of the prior art, it has heretofore been proposed to employ a layer of silver halide in place of the metallic silver overcoat that is illustrated in FIG. 3, and to use that layer to provide metallic silver in response to irradiation. In the present invention, the silver halide deposit 22 is irradiated with actinic radiation, either with an electron beam (not shown) or through a suitable apertured mask 16, to produce in the silver halide deposit a latent silver image 24, replicating the pattern desired to be imposed on the substrate 10. This is illustrated in FIG. 7. FIG. 8 shows the developed metallic silver image 26 on the outer surface of the resist material 12. By photographic techniques the image can be fixed, and the unexposed silver halide removed, to provide a metallic silver replication of a desired pattern on the resist material, as is illustrated in FIG. 9. At this stage heat, such as infrared radiation according to the prior art, can be employed to photodope the resist material 12 in regions 28 immediately underlying the metallic silver pattern 26, as is illustrated in FIG. 10. Irradiation is presently preferred over simple heating, partly because irradiating may tend to drive the silver directly into the chalcogenide rather than merely letting the silver diffuse into the glass, thus producing cleaner, sharper lines. FIG. 11 shows the end product of etching away the unprotected resist material, this step being in accordance with the prior art, leaving islands of resist material 12' covered with doped regions 28 corresponding to regions 20 as are illustrated in FIG. 5.

"Actinic radiation" as used in this specification is any radiation which can form a latent image in the silver halide to produce a developable image; this includes electron beams, ion beams, X-rays, light, and the like.

The step of fixing the developed image 26 may be omitted, and the silver halide deposit 22 with the metallic silver image 26 in it may be irradiated with infrared radiation to photodope the substrate 12, giving the product shown in FIG. 10. The silver halide is transparent to infrared radiation, and remains on the surface 32 (not shown in FIG. 10). Thereafter, the silver halide can be removed in the same step which etches away the resist material that is not protected by the doped-in silver. Suitable agents for this simultaneous fixing and etching step are ammonium hydroxide (for AgCl and AgBr), or an alkaline photographic fixing agent.

Figure 12:
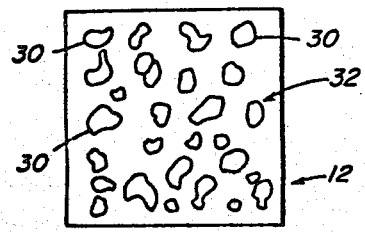
Figure 13:
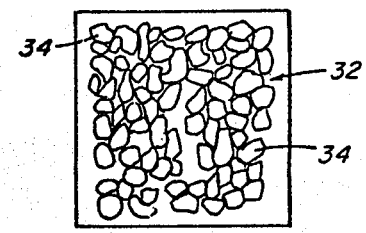

The silver halide layer 22 is not necessarily a continuous layer. The amount of silver required to provide effective doping as at 20 or 28 in FIGS. 5 and 11, respectively, is believed to be small. The photographic process employing a silver halide photographic material is not only faster than processes heretofore used in making microlithographic patterns on semiconductors and the like; it is also capable of producing large amounts of silver out of very small amounts of silver halide by photographic techniques. Accordingly, the silver halide deposit 22 can be the result of distributing silver halide over the outer surface of the resist material 12 to a thickness ranging from 100 anstrom units to a thickness that is known to be useful for photographic purposes (exemplified by approximately 0.3 micrometer). For the present invention a layer substantially thinner than 0.3 micrometer is preferred generally about 0.1 micrometer and as a preferred thickness between about 0.05 and about 0.2 micrometer. A very thin layer may produce cleaner, finer lines in the final product. At the lower end of the thickness range, there can be a "layer" which is not continuous and in which there are particles that are separated from all neighboring particles. Such a distribution is illustrated in FIG. 12 in which aggregates 30 of silver halide are shown distributed over the surface 32 of the underlying resist material 12. The aggregates are in effect micro-sized clumps of silver halide which do not necessarily touch each other. A more compacted distribution is illustrated in FIG. 13 in which small aggregates 34 of silver halide are shown on the surface 32 but more closely packed together and having a large proportion of them touching each other. This does not exclude the possibility of a continuous layer of silver halide material at the upper end of the thickness range.

Figure 14:
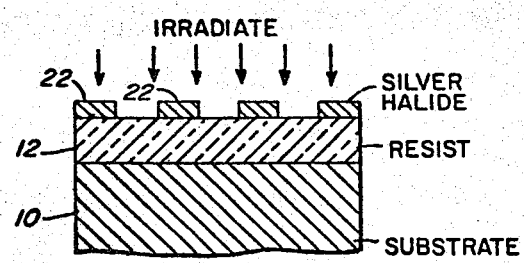
Figure 15:
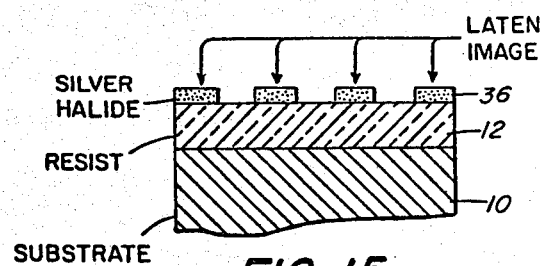
Figure 16:
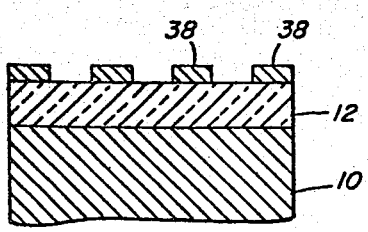
Figure 17:
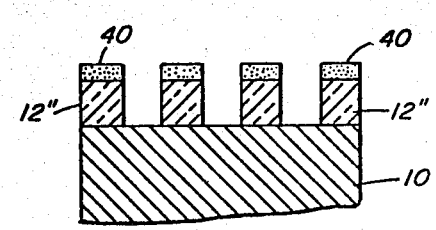

FIGS. 14 to 17, inclusive, illustrate a second embodiment of the invention, in which a positive replication of the desired pattern is formed on the substrate 10. Beginning with the process as it is illustrated in FIGS. 7 and 8, this embodiment removes from the intermediate article shown in FIG. 8 the metallic silver replication 26, leaving the undeveloped silver halide 22 in place as is shown in FIG. 14. Metallic silver can be removed by use of a light application of nitric acid or other silver bleach agent, or a silver-dissolving agent, several of which are known in photographic art. Then as is illustrated in FIG. 14, the silver halide 22 that remains is irradiated with a flood light (visible light is adequate), to produce a latent image 36, consisting essentially of silver atoms in a matrix of silver halide, on the surface 32 of the resist material 12, as is illustrated in FIG. 15. Then, by the usual photographic process of developing to a silver image 38 and fixing, a metallic silver replication of a positive image is formed, as is shown in FIG. 16. This metallic image can then be used to dope the underlying resist material 12 forming doped regions 40. Thereafter, the uncovered regions of the resist material 12 are etched away to provide islands 12" delineating the photolithographic pattern that is desired on the substrate material 10. The benefit of the second embodiment of the invention is that it provides for the first time the opportunity to obtain a positive or a negative mask on a semiconductor chip, using the same starting chalcogenide resist material.

Figure 18:
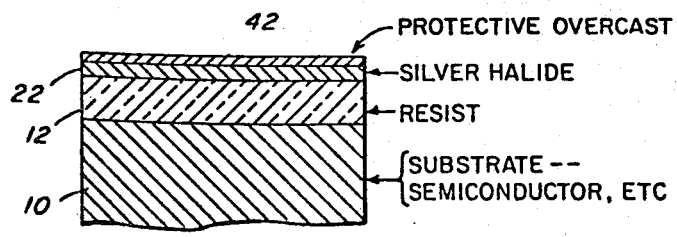

Silver halide layers, especially very thin silver halide layers, are fragile and can be damaged in operations such as dipping into nitric acid or into sodium hydroxide etchants. For that reason, it may be desired to use the silver halide layer 22 with a material such as a gelatin to give it physical protection while permitting chemical and physical operations on it. Such a protective overcoat 42 is illustrated in FIG. 18.

The following example is presented to illustrate the production of a microlithographic product such as a mask for the production of a multiplicity of micro semiconductor chips.

EXAMPLE 1

A quartz plate, or other substrate, is placed in a vacuum system which is then evacuated to a pressure between $5 \times 10^{-6}$ and $1 \times 10^{-5}$ Torr. Arsenic trisulfide is evaporated from a molybdenum boat at a rate of 10 to 20 Å per second as measured on a quartz crystal thickness monitor. Evaporation is continued to obtain a layer of arsenic trisulfide about 0.3 micrometer thick. The thickness of the arsenic trisulfide layer is not critical, and a uniform layer between 0.1 and 0.5 micrometer is sought.

A layer of silver bromide is evaporated over the arsenic trisulfide. At a pressure of approximately $1 \times 10^{-5}$ Torr, silver bromide is evaporated from a tungsten boat held at a temperature of 615° C., to a thickness of about 100 Å. The product is a three layer member comprising a quartz plate, an arsenic trisulfide layer and a top layer of silver bromide.

This three layer product is exposed to suitable actinic radiation, for example to direct writing of a pattern with an electron beam. In one embodiment the beam pattern represents a semiconductor electronic circuit. The exposed layer is developed in a solution containing:

| | |
|---|---|
| hydroquinone | 2.5 g/1000 ml. |
| p-methylaminophenol sulfate | 0.67 |
| sodium sulfite | 26 |
| sodium carbonate | 26 |
| gelatin | 1.67 | for a period of 30 seconds. At this point there are several options, depending on the nature of the product desired and depending on desired procedures. In this example, the developed and unfixed image is exposed to a 250 W. infrared lamp for 30 minutes (filtered to be sure that all visible light is removed), to drive the silver image into the arsenic trisulfide layer to form a photo-doped arsenic pattern.

Alternatively, the developed silver image can be removed by placing the plate in 4 molar nitric acid for 30 seconds. The remaining silver bromide is then fogged by exposure to light or other actinic radiation, and is developed again in a like developer solution to form an image of opposite sense. The resulting silver image is then driven into the arsenic trisulfide layer by exposure to infrared light. As another alternative, the silver bromide can be removed from the original developed image, and the plate either flooded with infrared light or stored for later treatment.

After photo-doping, the arsenic trisulfide layer is etched by conventional methods to form an etched layer of arsenic trisulfide on a quartz substrate, suitable for use as a mask for the production of semiconductor electronic circuits. The optical density of the pattern reaches a value of 1.0 for radiation at about 420 micrometer and a value of 2.0 at about 393 micrometer. Mercury lines at 365 micrometer or 405 micrometer will be sufficiently absorbed by the pattern to prevent exposure in the masked areas.

The preceding Example is illustrative of procedures for placing an arsenic trisulfide glass, a germanium selenium glass or other chalcogenide glass on a suitable substrate, for depositing thereon a silver halide layer, and for exposing and developing such a layer to form a developed photographic silver image on the glass. Thereafter, the silver image is caused to move into the glass, forming a photo-doped chalcogenide glass layer on the substrate. As is known, the photo-doped chalcogenide glass can then be etched to form a microlithographic resist.

We claim:

1. A unitary product comprising, as a substrate, a semiconductor body having a surface on which a micro pattern is to be imposed, a layer of chalcogenide glass material on said surface and, on the outer surface of said chalcogenide glass material, a silver image replicating said pattern, said silver image consisting primarily of metallic silver atoms in a silver halide matrix.

* * * * *